United States Patent

Aiello et al.

[19]

[11] Patent Number: 6,084,286
[45] Date of Patent: *Jul. 4, 2000

[54] INTEGRATED DEVICE IN AN EMITTER SWITCHING CONFIGURATION AND WITH A CELLULAR STRUCTURE

[75] Inventors: Natale Aiello, Catania; Vito Graziano; Atanasio La Barbera, both of Palermo; Stefano Sueri, Catania, all of Italy

[73] Assignee: SGS-Thomsom Microelectronics, S.r.l., Agrate Brianza, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/864,653

[22] Filed: May 28, 1997

[30] Foreign Application Priority Data

May 29, 1996 [EP] European Pat. Off. ............... 96830306

[51] Int. Cl.[7] .................................................. H01L 29/00
[52] U.S. Cl. ......................... 257/553; 257/502; 257/566; 257/587
[58] Field of Search .................................... 257/499, 500, 257/502, 552, 553, 565, 566, 587

[56] References Cited

U.S. PATENT DOCUMENTS

| | | | |
|---|---|---|---|
| 3,772,100 | 11/1973 | Masuda et al. .............................. | 156/3 |
| 5,204,735 | 4/1993 | Yamamoto et al. ..................... | 257/528 |
| 5,376,821 | 12/1994 | Puzzolo et al. .......................... | 257/566 |
| 5,399,899 | 3/1995 | Dekker et al. ........................... | 257/566 |
| 5,500,551 | 3/1996 | Puzzolo et al. .......................... | 257/500 |
| 5,631,495 | 5/1997 | Dunn et al. .............................. | 257/587 |

FOREIGN PATENT DOCUMENTS

| | | |
|---|---|---|
| 0 493 854 | 7/1992 | European Pat. Off. . |
| 0322040 B1 | 5/1993 | European Pat. Off. . |

OTHER PUBLICATIONS

"Bipolar Transistor Structure," *IBM Technical Disclosure Bulletin*, vol. 21, No. 2, pp. 846–849, Jul. 1978.

*Primary Examiner*—Mahshid Saadat
*Assistant Examiner*—George C. Eckert, II
*Attorney, Agent, or Firm*—Jenkens & Gilchrist, P.C.; Theodore E. Galanthay

[57] ABSTRACT

An integrated device comprises a high-voltage transistor and a low-voltage transistor in an emitter-switching configuration integrated in a chip (400) of semiconductor material comprising a buried P-type region (120) and a corresponding P-type contact region (405) which delimit a portion of semiconductor material within which the low-voltage transistor is formed. The contact region (405) has a network structure such as to divide this portion of semiconductor material into a plurality of cells (410) within each of which there is an elemental P-type base region (425) and an elemental N-type emitter region (430) of the low-voltage transistor. The elemental regions (425) and (430) of the various cells (410) are electrically connected to one another by means of surface metal contacts.

20 Claims, 8 Drawing Sheets

INTEGRATED DEVICE IN AN EMITTER SWITCHING CONFIGURATION AND WITH A CELLULAR STRUCTURE

BACKGROUND OF THE INVENTION

1. Technical Field

The present invention relates to semiconductor integrated devices and, in particular, but in non-limiting manner, to an integrated device employing an emitter-switching configuration.

2. Prior Art

One particular type of device in an emitter-switching configuration is constituted by a bipolar transistor and an electronic switch in series with the emitter of the bipolar transistor. The opening of the electronic switch enables the bipolar transistor to be turned off extremely quickly and this configuration is therefore commonly used in applications in which the bipolar transistor is required to be able to switch quickly between its conduction and turned-off states.

Typically, the bipolar transistor is a high-voltage power transistor and the electronic switch is constituted by a low-voltage bipolar power transistor in which the emitter terminal of the high-voltage transistor is connected to the collector terminal of the low-voltage transistor; the high-voltage transistor typically has a collector-base junction breakdown voltage with open emitter ($Bv_{cbo}$) which may reach 1000V, whereas the low-voltage transistor has a breakdown voltage of between 20V and 50V.

In a device in an emitter-switching configuration integrated in a chip of semiconductor material in which the substrate of the chip is part of the collector region of the high-voltage transistor, the low-voltage transistor can be formed inside the emitter region of the high-voltage transistor.

By way of example, a prior art integrated structure formed with the use of the VIPower process (VIPower is a trade mark of SGS-THOMSON MICROELECTRONICS S.r.l.) will be considered. In the VIPower process, the chip of semiconductor material is constituted by a semiconductor substrate with a first type of conductivity, on which an epitaxial layer doped with the same type of impurities is formed. High-voltage transistors are constructed with a structure with completely vertical conduction in which the various P-N junctions are buried in the epitaxial layer and the collector electrode is formed on the back of the chip, that is, on the opposite face of the substrate to that with the epitaxial layer. This construction process is described in European patent application EP-322040 in the name of SGS-THOMSON MICROELECTRONICS S.r.l.

A schematic, perspective view of a portion of this integrated device is shown in FIG. 1a. The integrated device is formed in a chip 100 of semiconductor material comprising a substrate 105 of monocrystalline silicon strongly doped with N-type impurities (N+); a first epitaxial layer 110 with the same type of conductivity N but with a low concentration of impurities (N-) is formed on the substrate 105 by epitaxial growth.

P-type regions having a concentration of impurities of intermediate value (P) are formed by implantation on the surface of the epitaxial layer 110; regions with N-type doping are then formed on these P-type regions by a subsequent implantation step. A second N-type epitaxial layer 115 having a (greater concentration of impurities than that of the first layer 110 is formed thereon by epitaxial growth.

During this stage, which takes place at high temperature, the implanted P-type and N-type regions described above extend by diffusion in the two epitaxial layers, giving rise to buried regions which define buried P-N junctions. In particular, the P-type region 120 constitutes a buried base region of the high-voltage transistor, whereas the N-type region 125 forms a buried region constituting the emitter region of the high-voltage transistor and the collector region of the low-voltage transistor.

A P-type region 130 having a high concentration of impurities is then formed in the second epitaxial layer 115 by known masking and diffusion techniques; this region 130 extends all the way through the second epitaxial layer 115 and is connected to the buried base region 120 of the high-voltage transistor, constituting a deep base contact region of that transistor.

An N-type region 135 with a high concentration of impurities is then formed by similar implantation techniques (or alternatively by a deposition process) and diffusion techniques and extends in the second epitaxial layer 115 as far as the respective buried region 125.

A P-type region 140 which defines the base region of the low-voltage transistor and a further high-concentration N-type region 145 which defines the emitter region of the low-voltage transistor are then implanted and diffused by similar techniques.

Openings for contact with surface regions of the various components are then formed on the front face of the chip which is covered by an insulating layer 150 (typically silicon dioxide) by known deposition, masking and etching techniques. In particular, the hole 155 defines a region for contact with the base region 120, 130 of the high-voltage transistor and the openings 160 and 165 define a region for contact with the base region 140 and a region for contact with the emitter region 145 of the low-voltage transistor, respectively.

Metal strips formed by a subsequent metallization step are in contact with surface regions of the various components in the respective openings defined above. In particular, the metal strip 170 in contact with the base region 120, 130 of the high-voltage transistor through the hole 155 defines the base electrode (Bh) thereof; the metal strips 175 and 180 in contact with the base region 140 and the emitter region 145, respectively, of the low-voltage transistor through the openings 160 and 165 define the base electrode (Bl) and the emitter electrode (El) of the low-voltage transistor Tl, respectively.

A metal layer 185 formed on the base of the chip, that is, on the free surface of the substrate 105, constitutes the collector electrode (Ch) of the high-voltage transistor.

In plan, the structure described above has so-called interdigitated geometry in which the emitter electrode of the low-voltage transistor is spread out in the form of a comb with elongate portions (fingers) within the base electrode of the high-voltage transistor. Each individual elongate portion of the emitter electrode of the low-voltage transistor disposed between two adjacent fingers of the base electrode of the high-voltage transistor is constituted by a pair of fingers between which there is a metal strip; this set of metal strips constitutes the base electrode of the low-voltage transistor.

This structure is clearly visible in FIG. 1b, which is a plan view of the entire device before the metallization step. The darkened regions represent the contact openings cut in the insulating layer 150; in particular, the finger-like structure of the hole 155 for contact with the base of the high-voltage transistor and the finger-like structure of the hole 165 for contact with the emitter of the low-voltage transistor, within which there are openings 160 for contact with the base of the same low-voltage transistor, can be seen.

In the interdigitated structure described above, the emitter regions of the two power transistors have long perimeters and their emitter-base junctions therefore have low resistance enabling the power transistors to withstand the application of large currents.

This known integrated circuit has some disadvantages. Experimental analysis has shown that, in applications in which the power device described above is subject to large switching currents applied between the collector terminal Ch of the high-voltage transistor and the emitter terminal El of the low-voltage transistor, and to very rapid variations of the potential of the collector terminal of the high-voltage transistor over time (dV/dt), an extension of the turn-off times occurs. This problem limits the frequency response of the device since it cannot be used in applications in which it is made to switch rapidly between its conduction and turned-off states.

SUMMARY OF THE INVENTION

The problems of the prior art are prevented by the invention as claimed. In fact, the present invention provides an integrated device comprising first and second bipolar transistors in an emitter-switching configuration, integrated in a chip of semiconductor material with a first type of conductivity having first and second opposed surfaces, the device comprising a first region with a second type of conductivity comprising a first buried region and a first contact region extending from the first surface as far as the first buried region and delimiting a first portion of the semiconductor material, a second portion of the semiconductor material being disposed between the first buried region and the second surface, first conductive means on the first surface in contact with the first contact region constituting a base electrode of the first transistor, second and third conductive means on the first surface constituting a base electrode and an emitter electrode of the second transistor, respectively, and fourth conductive means on the second surface in contact with the second portion constituting a collector electrode of the first transistor, the second portion, the first region and the first portion containing the collector, base and emitter regions of the first transistor, respectively, the second transistor being formed within the first portion, characterized in that the first contact region has a network structure such as to divide the first portion into a plurality of cells, each cell comprising a second buried region with the first type of conductivity forming a junction with the first buried region, a second region with the second type of conductivity extending from the first surface into the cell, a third region with the first type of conductivity extending from the first surface into the second region and a fourth region with the first type of conductivity disposed between the second region and the second buried region, each of the second and third regions being connected, respectively to the second and third conductive means, the set of fourth, second and third regions constituting the collector, base and emitter regions of the second transistor, respectively.

The device according to the present invention has improved switching performance and is thus suitable for use in higher-frequency applications.

BRIEF DESCRIPTION OF THE DRAWINGS

Various embodiments of the present invention will now be described by way of example, with reference to the appended drawings, in which.

DETAILED DESCRIPTION OF A PREFERRED EMBODIMENT OF THE INVENTION

Figure 1A:
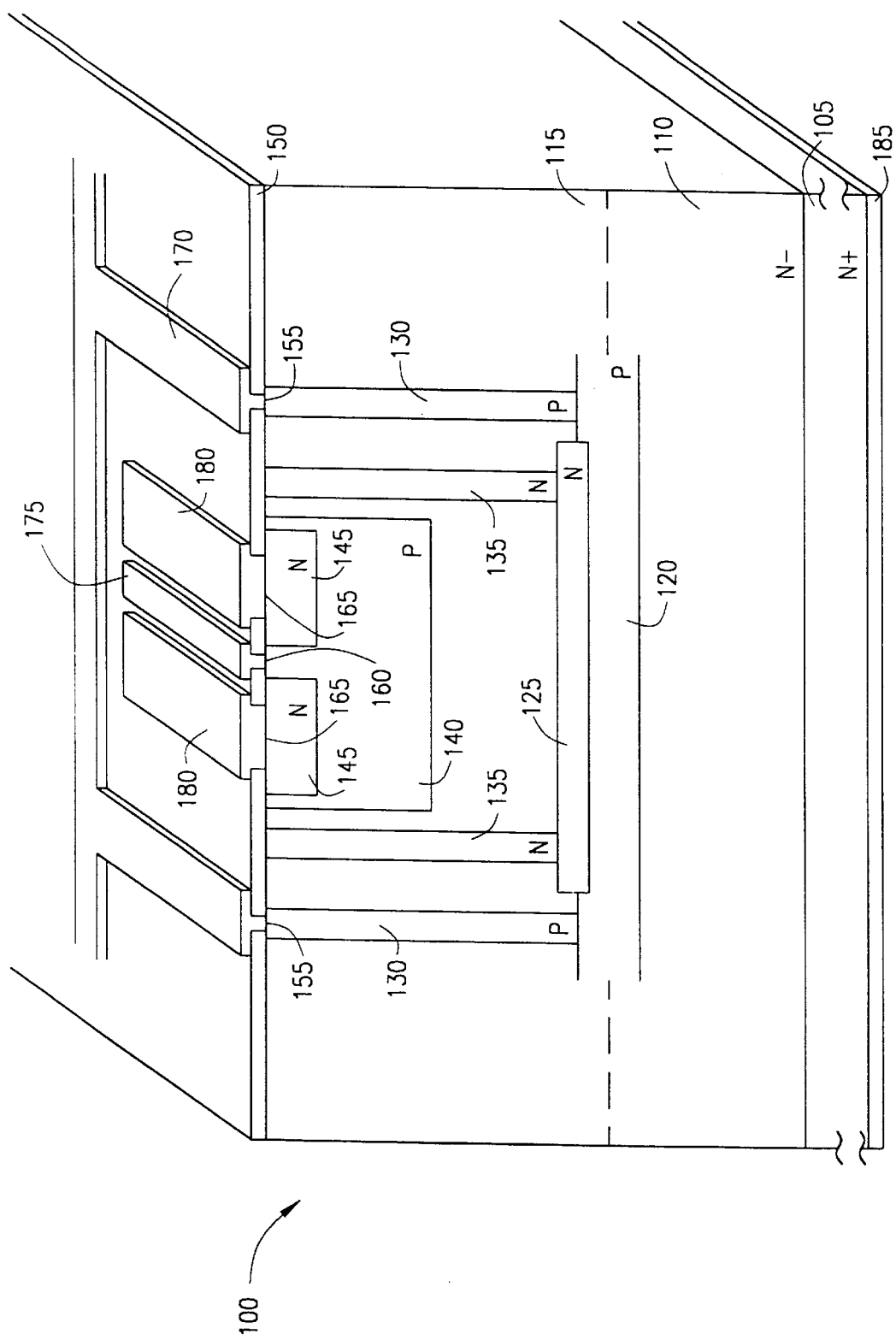
FIG. 1a is a schematic, perspective view of a portion of a known integrated device.
Figure 1B:
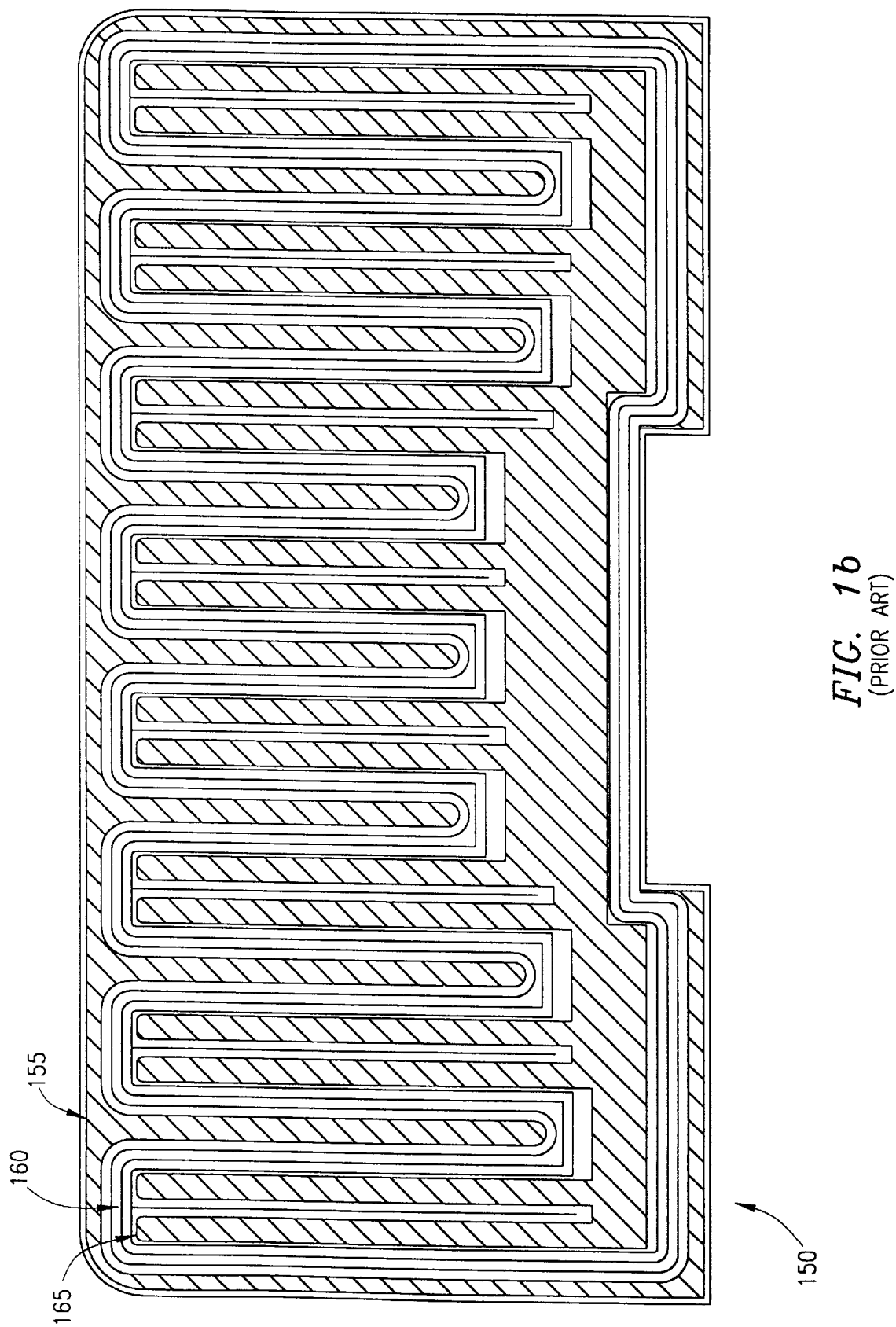
FIG. 1b is a plan view of the entire known integrated device before the metallization stage.
Figure 2:
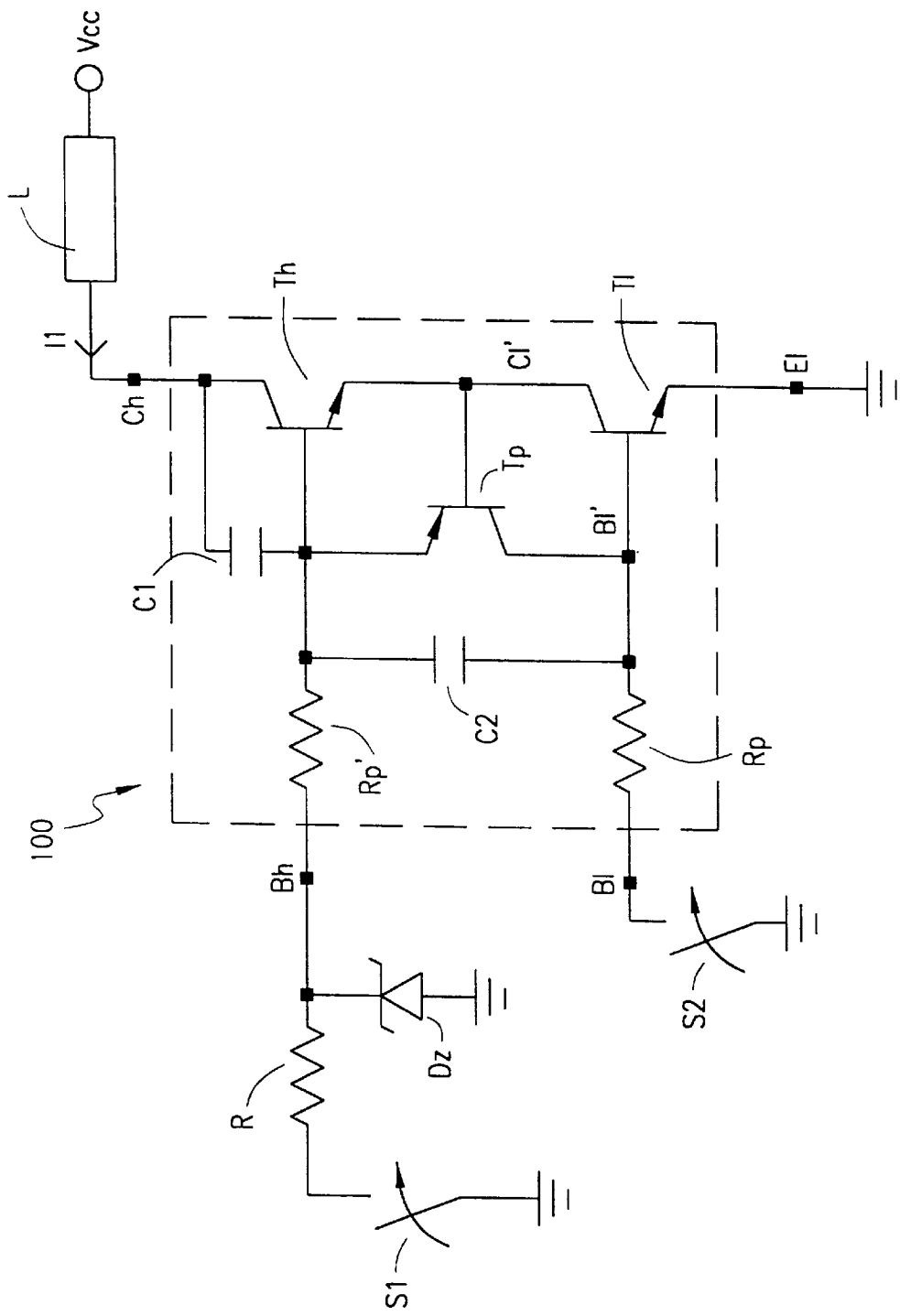
FIG. 2 is a circuit diagram including the circuit equivalent to the known integrated device.

With reference now to the drawings and, in particular, with reference to FIG. 2 (FIGS. 1a and 1b have been described above), this is a circuit diagram including the circuit equivalent to the known integrated device described above. The integrated device 100 is connected in the circuit shown in the drawing by means of the collector and base terminals Ch and Bh of the high-voltage transistor and the emitter and base terminals El and Bl of the low-voltage transistor. In particular, the terminals Bl and Bh constitute the control terminals of the device which enable the connection between two branches of the circuit connected to the terminals El and Ch to be opened and closed alternately. The terminal Ch is connected to the first terminal of a load L, the second terminal of which is connected to the positive terminal of a supply (Vcc); the terminal El is connected to a reference terminal (earth) which is connected to the negative terminal of the supply.

The base terminal Bh of the high-voltage transistor is connected to the cathode of a Zener diode Dz the anode of which is connected to the earth terminal. The same base terminal Bh is connected, by means of a resistor R, to the first terminal of a switch S1, the second terminal of which is connected to the earth terminal. The base terminal Bl of the low-voltage transistor is connected to the earth terminal by means of a further switch S2.

The integrated device 100 includes a high-voltage NPN transistor Th constituted, with reference to FIG. 1a, by the portion of N-type semiconductor material disposed between the buried region 120 and the lower surface of the chip (the collector region), by the P-type region 120, 130 (the base region), and by the N-type region (including the buried region 125 and the enrichment region 135) delimited by the region 120, 130 (the emitter region). The device 100 also includes a low-voltage NPN transistor Tl constituted by an N-type collector region in common with the emitter region of the transistor Th, by the P-type base region 140 and by the N-type emitter region 145.

At the various P-N junctions in the integrated device 100 there are parasitic capacitances the values of which depend upon the type of polarization thereof. In particular, a parasitic capacitance represented by the capacitor Cl formed by the junction between the N-type region 110 and the P-type region 120 is present between the collector terminal and the base terminal of the high-voltage transistor Th; a further parasitic capacitance represented by the capacitor C2 is present between the base terminal of the transistor Th and the base terminal of the low-voltage transistor Tl and is constituted by the series of two parasitic capacitors formed by the two P-N junctions disposed between the P-type region 140 and the buried P-type region 120. Further parasitic capacitances present in the integrated structure may be considered negligible in the embodiment in question and are therefore not shown in the drawing.

A parasitic PNP transistor Tp is also created by the P-type region 140 (the collector region in the embodiment in question), by the N-type region delimited by the region 120, 130 (the base region), and by the P-type region 120, 130 (the emitter region). As shown in the drawing, the emitter terminal of the transistor Tp is connected to the base terminal of the transistor Th (common region 120, 130), the base terminal of the transistor Tp is connected to the emitter terminal of the transistor Th and to the collector terminal of the transistor Tl (the region delimited by the common region 120, 130) and the collector terminal of the transistor Tp is connected to the base terminal of the transistor Tl (the common region 140).

The resistor Rp present between the base terminal of the low-voltage transistor Tl and the terminal Bl represents the distributed layer resistance between the active base region of the transistor Tl (the P-type region 140) and the corresponding base terminal Bl; similarly, the resistor Rp' present between the base terminal of the high-voltage transistor Th and the terminal Bh represents the distributed layer resistance between the active base region of the transistor Th (the P-type region 120, 130) and the corresponding base terminal Bh.

Figure 3:
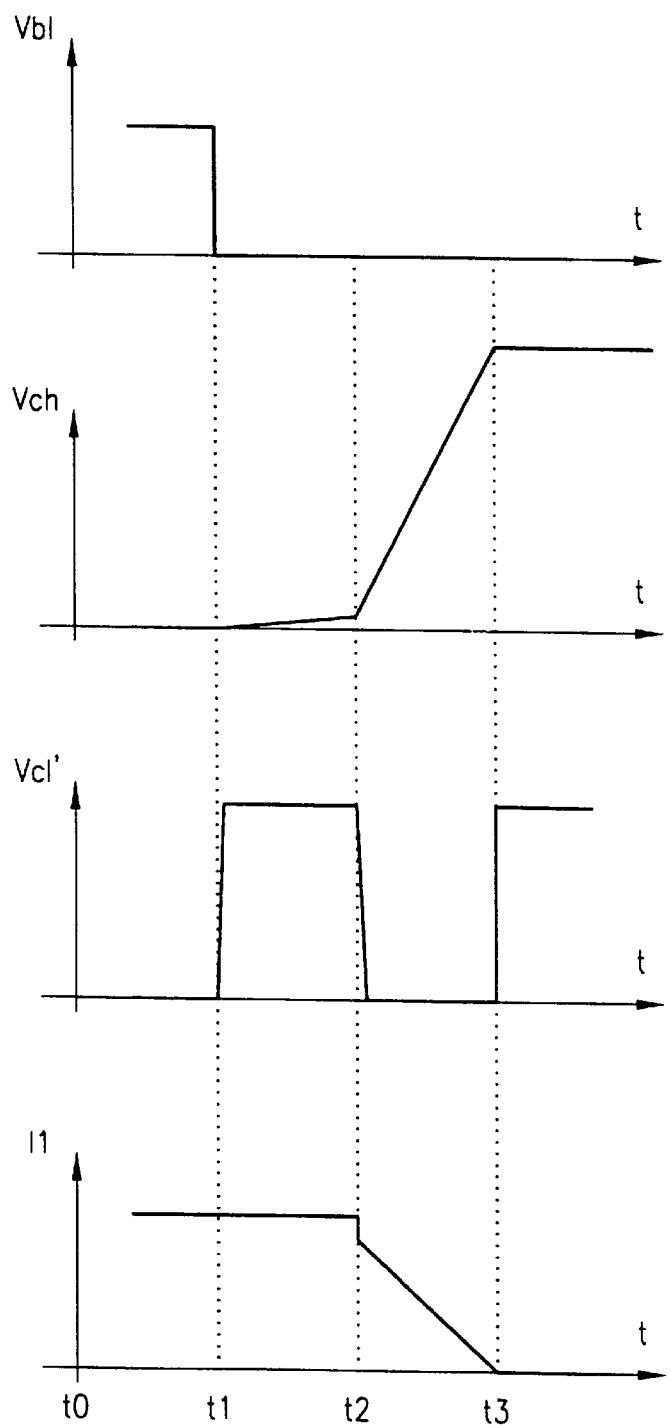
FIG. 3 shows the variation of some electrical quantities of the circuit of FIG. 2, in a qualitative time graph.

With reference now to FIG. 3, the variations of some electrical quantities of the circuit of FIG. 2 are shown in qualitative time graphs. In particular, the first graph shows the variation with time of the potential (Vbl) of the terminal Bl, the second graph shows the variation of the potential (Vch) of the terminal Ch, the third graph shows the variation of the potential (Vcl') of the internal collector terminal of the transistor Tl (Cl' in FIG. 2), all measured relative to earth, and the fourth graph shows the variation of the current through the load L (Il in FIG. 2).

An initial condition in which the two transistors Th and Tl are conducting and a certain current is flowing through the load L will now be considered. The potentials of the base terminals Bl and Bh are high, whereas the potential of the collector terminal of the transistor Th (Vch) and that of the internal collector terminal of the transistor Ti (Vcl') are low.

At time t1, the two switches S1 and S2 are closed, starting the switching stage of the two transistors Tl and Th. The potential of the base terminal Bl (Vbl) is brought to zero; upon completion of the turning-off stage of the low-voltage transistor Tl, which is considered negligible in comparison with that of the high-voltage transistor Th, the potential of the internal collector terminal of the transistor Tl (Vcl') is brought to a high value. When the transistor Tl is turned off, its collector current, which corresponds to the emitter current of the transistor Th, is brought to zero.

The turn-off time of the high-voltage transistor Th, however, is greater because of the large accumulation of charges in its base region. Consequently, after the transistor Tl has been turned off, bringing the emitter current of the transistor Th to zero, the collector current of the transistor Th flows through its base and the internal resistor Rp', and is discharged to earth through the Zener diode Dz.

Once the high-voltage transistor Th has eliminated all of the residual base charges (time t2) the transistor Th is turned off. Its collector current is brought to zero and the potential of the collector terminal of the transistor Th (Vch) starts to be brought to a high value.

This variation (dV/dt) of the potential of the terminal Ch generates a transitory phenomenon in the RC network constituted by the capacitors C1 and C2 and by the resistors Rp and Rp'. During this transitory stage, the current Il flows through the capacitor C1 and starts to fall to zero, being discharged to earth through the resistor Rp' and the capacitor C2 and the resistor Rp in series. The transitory phenomenon thus generated produces a voltage pulse at the internal base terminal of the transistor Tl (Bl' in FIG. 2). It can be seen from an observation of the circuit diagram shown in the drawing that the NPN transistor Tl and the PNP transistor Tp define an SCR; in particular, the emitter terminal of the transistor Tp constitutes the anode of the SCR, the emitter terminal of the transistor Tl constitutes the cathode, and the internal base terminal of the transistor Tl (Bl') constitutes the control electrode. The voltage pulse described above applied to the control electrode of the SCR therefore starts it resulting in conduction between the anode and the cathode. In greater detail, the voltage pulse at the internal base terminal of the transistor Tl (Bl') switches on the NPN transistor Tl so that the potential of its internal collector terminal (Vcl') is brought to zero. This switches on the parasitic PNP transistor Tp which is supplied by means of the capacitor C1 and causes the entire power device to be switched on again, with conduction between its terminals El and Ch.

Once the current Il has been brought to zero (time t3) the SCR structure formed by the transistors Tl and Tp is turned off and the potential of the collector terminal of the transistor Th (Vch) reaches a high value equal to Vcc; the power device is thus brought to the correct turned-off state, completing its switching. It should be noted that the anomalous operation of the circuit with the starting of the SCR structure described above depends upon the value of the layer resistance Rp, whereas the duration t3–t2 of the transitory stage depends upon the time constant RC of the circuit constituted by the various parasitic components of the device and, in particular, upon the values of the layer resistances Rp and Rp'.

In the prior art structure shown in FIG. 1*a*, the values of the layer resistances Rp and Rp' depend upon the widths of the emitter fingers of the low-voltage transistor. These widths are dictated by current-flow requirements and the robustness of the device and cannot fall below certain values.

Figure 4A:
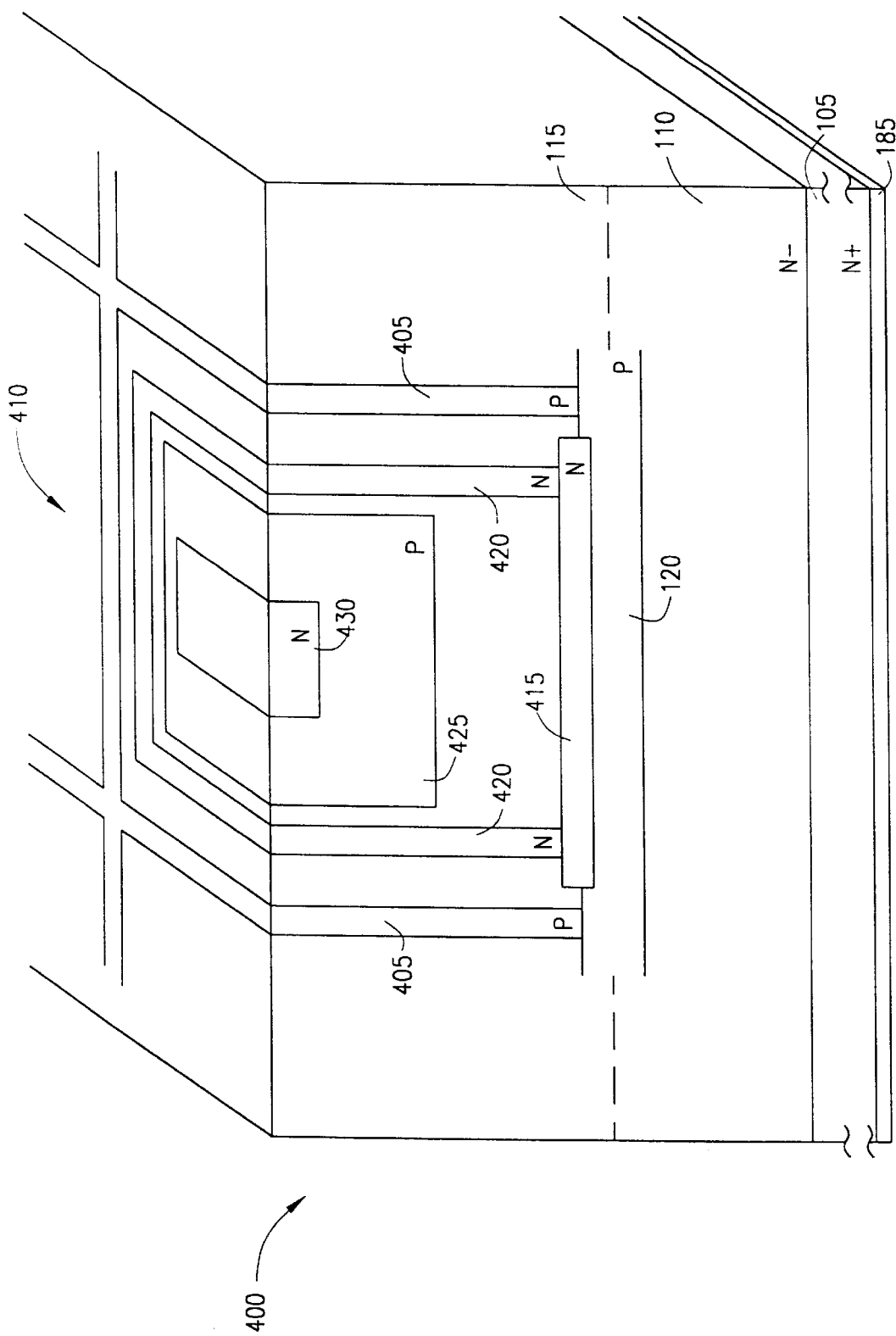
FIG. 4a is a schematic, perspective view of a portion of an integrated device according to the present invention.

With reference now to FIG. 4*a*, this is a schematic, perspective view of a portion of an integrated device according to the present invention. The integrated device is formed in a chip 400 of semiconductor material comprising an N+ substrate 105 on which a first N− epitaxial layer 110 is formed.

As described above, P-type regions are formed by implantation on the surface of the epitaxial layer 110 and N-type regions are then formed thereon by a subsequent implantation step; a second N-type epitaxial layer 115 is formed thereon by epitaxial growth. During this stage, which takes place at high temperature, the implanted P-type and N-type regions described above extend by diffusion in the two epitaxial layers giving rise to buried regions which define P-N junctions.

A P-type region 405 having a high concentration of impurities is then formed in the second epitaxial layer 115 by known masking and diffusion techniques and extends all the way through the second epitaxial layer 115, so as to be connected to a buried P-type region 120. The P-type region constituted by the regions 120 and 405 contains the base region of the high-voltage transistor and delimits a portion of the epitaxial layer 115 which contains the emitter region of the same transistor; the collector region of the high-voltage transistor is contained in the portion of the epitaxial layer 110 and of the substrate 105 disposed between the buried region 120 and the lower surface of the chip.

As shown in the drawing, the contact region 405 has a network structure such as to divide the emitter region of the high-voltage transistor into a plurality of isolated cells.

With reference, in particular, to a cell 410 (similar considerations apply to the other cells, not shown in the drawing) there is a buried N-type region 415 which forms a junction with a portion of the buried P-type region 120.

An N-type region 420 with a high concentration of impurities is then formed by similar implantation techniques (or alternatively by a deposition process) and diffusion techniques and extends in the second epitaxial layer 115; in the embodiment shown in the drawing, this enrichment region 420 extends as far as the respective buried region 415.

A P-type region 425 is then implanted and diffused by similar techniques, an N-type region 430 being formed therein.

The N-type region disposed between the buried region 415 and the region 425 contains an elemental collector region of the low-voltage transistor; the P-region 425 and the N-type region 430 contain, respectively, an elemental base region and an elemental emitter region of the same low-voltage transistor. The set of various elemental base and emitter regions formed in the various cells of the device (which are interconnected electrically as described in detail below) and the set cf various elemental collector regions define the base, emitter and collector regions of the low-voltage transistor, respectively. In other words, the low-voltage transistor can be seen as being constituted by a plurality of elemental transistors (each formed in a single cell) connected in parallel with one another.

The cellular structure of the device according to the present invention reduces the layer resistance (Rp) of the base region of the low-voltage transistor and that (Rp') of the base region of the high-voltage transistor as well as the size of the parasitic transistor (Tp) described above, thus reducing the problems encountered in known devices. In particular, the size of the cell 410 determines the value of the layer resistance Rp' of the base region of the high-voltage transistor and the size of the parasitic transistor Tp. The width of the region 425 determines the value of the elemental layer resistance of a single elemental base region of the low-voltage transistor; the total layer resistance Rp is given by these elemental resistances in parallel. Clearly, an increase in the cell size of the network of the structure according to the present invention reduces the effects of the parasitic elements described above. However, this reduction reduces the current-flow of the device as a result of the reduction of the areas of the emitter regions of the two transistors. The cell-size selected for the network is therefore a compromise solution between these two contrasting requirements.

It should be noted that the N-type enrichment region 420 is not strictly necessary. However, this region is useful because increased doping of the base region of the parasitic PNP transistor formed between the P-type region 420, the N-type region of the cell and the P-type region 120, 405 reduces its gain.

The front surface of the chip 400 is then coated with an insulating layer (not shown in the drawing) in which contact openings are formed by known deposition, masking and etching techniques for the subsequent metallization stage. The base electrode (Bh) of the high-voltage transistor and the base and emitter electrodes (Bl and El) of the low-voltage transistor Tl are formed in this stage, as described in detail below.

A metal layer 185 is formed on the base of the chip, that is, on the free surface of the substrate 105 and constitutes the collector electrode (Ch) of the high-voltage transistor.

Figure 4B:
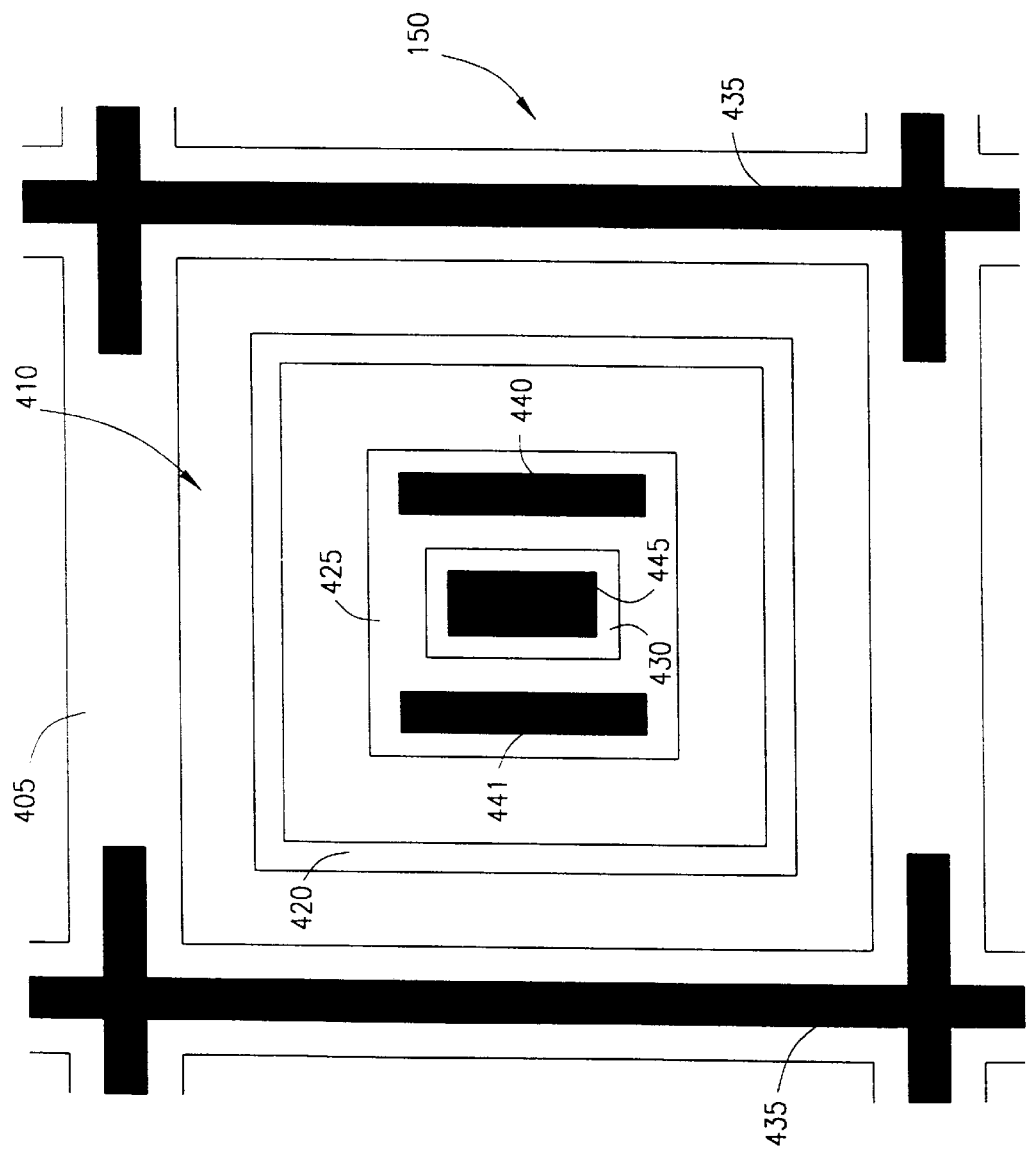
FIG. 4b is a plan view of the integrated device of FIG. 4a before the metallization stage.

With reference now to FIG. 4b, this is a plan view of the integrated device of FIG. 4a before the metallization stage. The chip 400 is covered with an insulating layer 150 beneath which the various regions of semiconductor material of the cell 410 described above can be seen. The blackened regions represent the contact openings cut in the insulating layer 150.

In particular, a hole 435, which defines a contact region with the base region 405, 120 of the high-voltage transistor can be seen; this hole 435 has a network structure which is broken to allow each cell to be connected to at least one adjacent cell by a single layer of metallization (as described in detail below). Typically, as shown in the drawing, a cell can be connected to two adjacent cells; this allows the various cells to be connected such that each cell is connected to a preceding cell and to a following cell, except for the first and last cells which are connected to a single adjacent cell.

In the cell 410, there are therefore openings 440, 441 and 445 which define regions for contact with the base region 425 and with the emitter region 430 of the low-voltage transistor, respectively. It should be noted that, in the embodiment of the present invention shown in the drawing, two separate contact openings 440 and 441 are provided for the base region 425; this measure further reduces the distributed layer resistance between the base region of the low-voltage transistor and the corresponding base terminal.

Figure 4C:
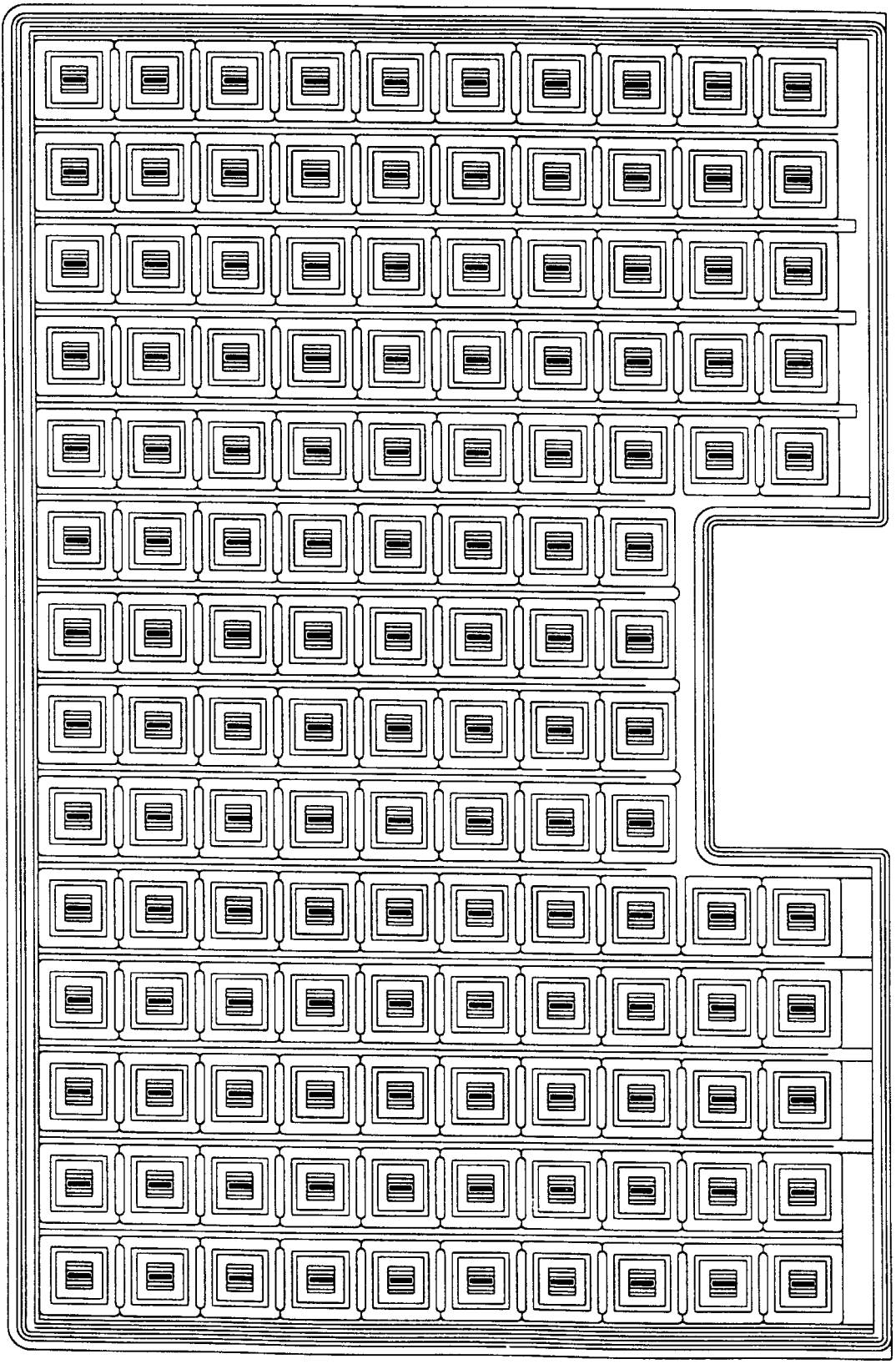
FIG. 4c is a plan view of the entire integrated device according to the present invention before the metallization stage.

The structure of the integrated device according to the present invention can be seen clearly in FIG. 4c which is a plan view of the entire device before the metallization stage. The network structure of the deep base contact region of the high-voltage transistor and the broken network structure of the corresponding contact hole can be seen therein; the various cells in which the various elemental low-voltage transistors are formed are thus visible.

Figure 4D:
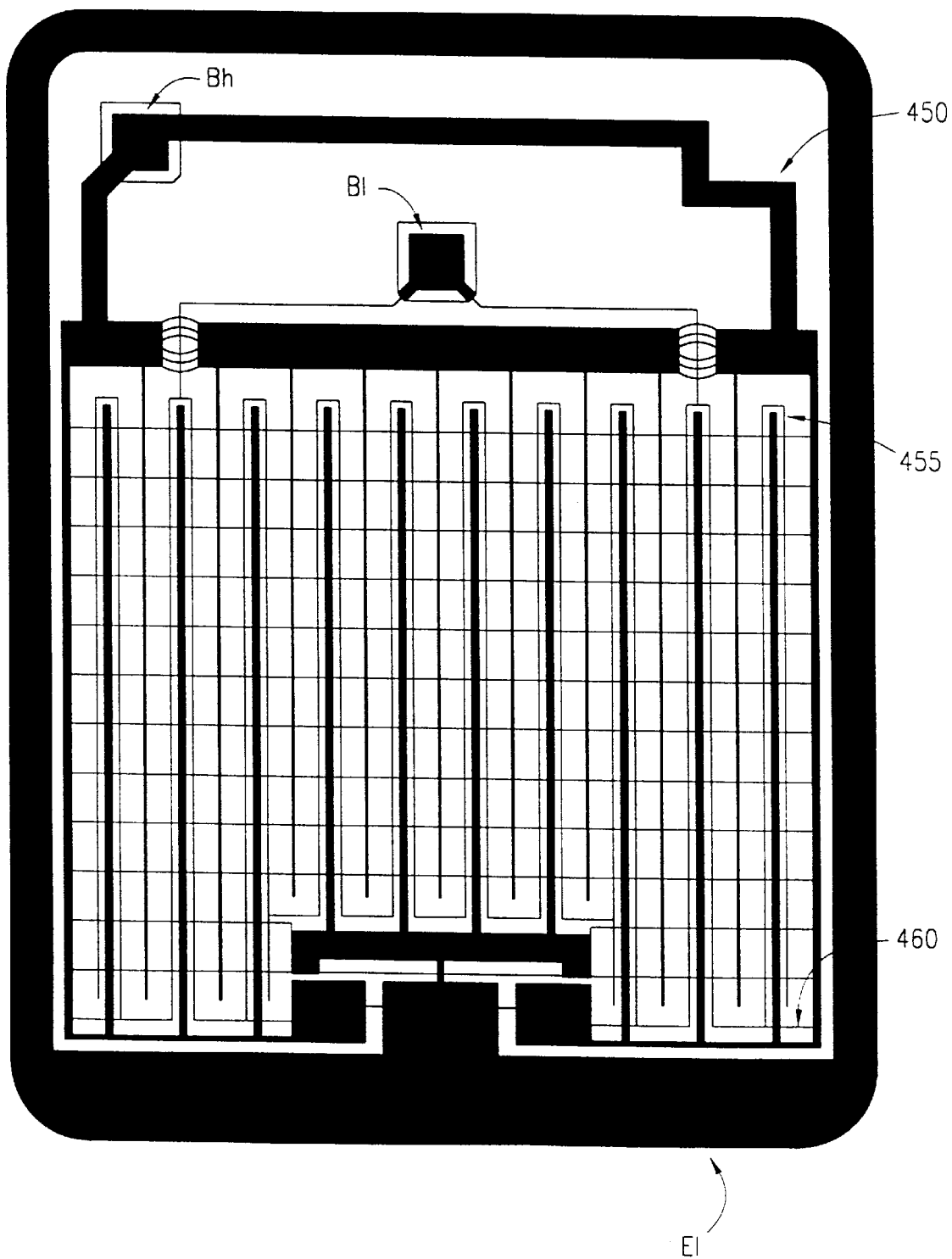
FIG. 4d is a plan view of the integrated device of FIG. 4c after the metallization stage.

With reference now to FIG. 4d, this is a plan view of the integrated device of FIG. 4c, after the metallization stage. In particular, it is possible to see a metal strip 450 (in contact with the base region 405, 120 of the high-voltage transistor through the hole 435) which defines its base electrode (Bh), and metal strips 455 and 460 (in contact with the base and emitter regions 425 and 430 of the low-voltage transistor, respectively, through the openings 440, 441 and 445) which define the base electrode (Bl) and the emitter electrode (El) of the low-voltage transistor, respectively. The metal strip 450 is constituted by a main element (comprising the base electrode Bh of the high-voltage transistor) from which a plurality of substantially parallel, elongate, herring-bone-shaped metallization elements extend perpendicularly; this shape improves contact with the base region of the high-voltage transistor Th. In the embodiment shown in the drawing, the base electrode Bl of the low-voltage transistor is formed in a separate region from the power device and contacts the various elemental base regions of the low-voltage transistor Tl in the most extensive possible manner by means of the metal strip 455.

It will be noted that this embodiment of the present invention achieves the necessary connections between the various regions with a single metallization layer. Experts in the art will appreciate that the same result can also be achieved by different geometry if the network structure of the hole 435 is broken at different points from those shown in the drawing. Alternatively, it is, of course, possible to use a closed network structure for the hole 435 without break points, the contacts between the elemental base and emitter regions of the individual cells being formed by means of a second metallization layer.

What is claimed is:

1. An integrated circuit device of an emitter-switching configuration in a chip of semiconductor material having a first type of conductivity, the device comprising:

a first region with a second type of conductivity comprising a first buried region and a first connecting region extending from a first surface of the semiconductor material as far as the first buried region and delimiting a first portion of the semiconductor material, a second portion of the semiconductor material being disposed between the first buried region and a second surface thereof;

the second portion, the first region and the first portion containing the collector, base and emitter regions of a first transistor, respectively, a second transistor being formed within the first portion;

the first connecting region having a network structure such as to divide the first portion into a plurality of cells, each of the cells being isolated from other cells by the first connecting region and the first buried region;

each cell comprising a second buried region with the first type of conductivity forming a junction with the first buried region, a second region with the second type of conductivity extending from the first surface into the cell, a third region with the first type of conductivity extending from the first surface into the second region and a fourth region with the first type of conductivity disposed between the second region and the second buried region; and the set of fourth, second and third regions constituting the collector, base and emitter regions of the second transistor, respectively.

2. A device, according to claim 1, further including:

first conductive means on the first surface in contact with the first connecting region constituting a base electrode of the first transistor, second and third conductive means and on the first surface constituting a base electrode and an emitter electrode of the second transistor, respectively, and fourth conductive means on the second surface in contact with the second portion constituting a collector electrode of the first transistor; and wherein the first conductive means has a broken network structure, and in which the first, second and third conductive means are formed by the same metallization layer.

3. A device, according to claim 2, wherein the first conductive means comprise an element from which a plurality of substantially parallel, elongate, herring-bone-like elements extend.

4. A device, according to claim 2, wherein the second conductive means contact each second region in two separate zones on opposite sides of a corresponding third region.

5. A device, according to claim 1, wherein each cell comprises a fifth region extending from the first surface towards a corresponding buried second region.

6. An integrated structure, according to claims 1, wherein the first type of conductivity is the N type and the second type of conductivity is the P type.

7. The device of claim 1, wherein:

each cell is continuously bounded on four sides by the first connecting region.

8. The device of claim 1, wherein:

the second and third regions of each cell are electrically isolated within the semiconductor material from second and third regions of other cells.

9. The device of claim 1, wherein:

the second transistor comprises a plurality of distinct third transistors connected in parallel relation to each other, each third transistor being formed by the second, third and fourth regions of a distinct cell.

10. The device of claim 1, wherein:

the plurality of cells form an array of cells, the cell array comprising a plurality of rows of cells, each row having a plurality of cells therein; and cells from different rows which are adjacent each other are separated by the first connecting region.

11. The device of claim 10, wherein:

the first conductive means extends continuously along opposed sides of each cell in the array in a first direction and partially along opposed sides of each cell in a second direction.

12. An integrated device of first and second transistors in a switched emitter configuration within a semiconductor material, the integrated device comprising:

a first portion forming a collector region of the first transistor;

a first buried layer disposed above the first portion;

a first region extending from the first buried layer to a first surface of the semiconductor material, the first region and the first buried layer containing a base region of the first transistor and dividing the semiconductor material into a plurality of cells, each cell being separated from each of the other cells and containing an emitter region of the first transistor;

a second buried layer disposed above the first buried layer within each cell, the second buried layer being delimited by the first region;

a second region extending from the first surface of the semiconductor material into each cell;

a third region within each cell defined between the second region and the second buried layer; and a fourth region extending from the first surface of the semiconductor material into each second region;

said second region, third region and fourth region of each cell forming the base, collector and emitter regions of a distinct second transistor.

13. The integrated device of claim 12, wherein:

each cell is continuously bounded by the first region.

14. The integrated device of claim 12, further including:

a first interconnect region in contact with the first region and extending continuously along opposed sides of each cell in a first direction and partially along opposed sides of each cell in a second direction.

15. The integrated device of claim 12, wherein:

the plurality of cells form an array of cells, the cell array comprising a plurality of rows of cells, each row having a plurality of cells therein, cells from different rows which are adjacent each other are isolated by the first region, and cells from the same row which are adjacent each other are isolated by the first region.

16. The integrated device of claim 12, wherein:

the second transistors form an electronic switch in series with the emitter region of the first transistor.

17. An integrated device of first and second transistors in a switched emitter configuration within a semiconductor material, the integrated device comprising:

a first portion forming a collector region of the first transistor;

a first buried layer disposed above the first portion;

a first region extending from the first buried layer to a first surface of the semiconductor material, the first region and the first buried layer containing a base region of the first transistor and dividing the semiconductor material into a plurality of cells, each cell being separated from each of the other cells and containing an emitter region of the first transistor;

a second region extending from the first surface of the semiconductor material into each cell;

a third region within each cell defined in an area between the second region and the first buried layer; and a fourth region extending from the first surface of the semiconductor material into each second region;

said second region, third region and fourth region of each cell forming the base, collector and emitter regions of a distinct second transistor.

18. The integrated device of claim 17, wherein:

each cell is continuously bounded by the first region.

19. The integrated device of claim 17, further including:

a first interconnect region in contact with the first region and extending continuously along opposed sides of each cell in a first direction and partially along opposed sides of each cell in a second direction.

20. The integrated device of claim 17, wherein:

the plurality of cells form an array of cells, the cell array comprising a plurality of rows of cells, each row having a plurality of cells therein, cells from different rows which are adjacent each other are isolated by the first region, and cells from the same row which are adjacent each other are isolated by the first region.

* * * * *

UNITED STATES PATENT AND TRADEMARK OFFICE
CERTIFICATE OF CORRECTION

PATENT NO. : 6,084,286
DATED : July 4, 2000
INVENTOR(S) : Natale Aiello

It is certified that error appears in the above-identified patent and that said Letters Patent is hereby corrected as shown below:

Column 5, line 48    Replace "transistor Ti"
                     With --transistor T1--

Column 7, line 35    Replace "set cf"
                     With --set of--

Signed and Sealed this

First Day of May, 2001

Attest:

NICHOLAS P. GODICI

Attesting Officer    Acting Director of the United States Patent and Trademark Office

UNITED STATES PATENT AND TRADEMARK OFFICE
CERTIFICATE OF CORRECTION

PATENT NO.    : 6,084,286
DATED         : July 4, 2000
INVENTOR(S)   : Natale Aiello It is certified that error appears in the above-identified patent and that said Letters Patent is hereby corrected as shown below:

<u>Title page,</u>
Item [73], Assignee, replace "SGS-Thomsom Microelectronics, S.r.l., Agrate, Brianza, Italy" with -- Consorzio per la Ricerca sulla Microelettronica nel Mezzogiorno, Catania, Italy --

Signed and Sealed this

Twenty-second Day of April, 2003

JAMES E. ROGAN
*Director of the United States Patent and Trademark Office*